(12) United States Patent
Vellore et al.

(10) Patent No.: US 10,916,464 B1
(45) Date of Patent: Feb. 9, 2021

(54) METHOD OF PRE ALIGNING CARRIER, WAFER AND CARRIER-WAFER COMBINATION FOR THROUGHPUT EFFICIENCY

(71) Applicant: Applied Materials, Inc., Santa Clara, CA (US)

(72) Inventors: Kim Ramkumar Vellore, San Jose, CA (US); Alexander N. Lerner, San Jose, CA (US); Steven Trey Tindel, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/552,967

(22) Filed: Aug. 27, 2019

Related U.S. Application Data

(60) Provisional application No. 62/879,341, filed on Jul. 26, 2019.

(51) Int. Cl.
  *H01L 21/68* (2006.01)
  *H01L 21/67* (2006.01)
  (Continued)

(52) U.S. Cl.
  CPC ........ *H01L 21/68* (2013.01); *H01L 21/67167* (2013.01); *H01L 21/67326* (2013.01);
  (Continued)

(58) Field of Classification Search
  None
  See application file for complete search history.

(56) References Cited

U.S. PATENT DOCUMENTS

| | | |
|---|---|---|
| 2007/0227941 A1 | 10/2007 | Narita et al. |
| 2017/0103910 A1 | 4/2017 | Chiou et al. |

(Continued)

FOREIGN PATENT DOCUMENTS

| | | |
|---|---|---|
| CN | 1490169 A | 4/2004 |
| CN | 1244165 C | 3/2006 |

(Continued)

OTHER PUBLICATIONS

International Search Report dated Oct. 8, 2020 for application No. PCT/US2020/038955.

*Primary Examiner* — Ronald P Jarrett
(74) *Attorney, Agent, or Firm* — Patterson + Sheridan LLP

(57) ABSTRACT

A method includes aligning and positioning a carrier in a predetermined orientation and location within a first front opening pod (FOUP) of a cluster tool, transferring the carrier to a charging station of the cluster tool, transferring a substrate from a second front opening pod (FOUP) of the cluster tool to the charging station and chucking the substrate onto the carrier, transferring the carrier having the substrate thereon from the charging station to a factory interface of the cluster tool, aligning the carrier having the substrate thereon in the factory interface of the cluster tool such that during substrate processing within a processing platform of the cluster tool the carrier is properly oriented and positioned relative to components of the processing platform, where the processing platform comprises one or more processing chambers, transferring the aligned carrier having the substrate thereon from the factory interface to the processing platform of the cluster tool for substrate processing, and transferring the aligned carrier having the processed substrate thereon from the processing platform to the factory interface.

13 Claims, 8 Drawing Sheets

(51) Int. Cl.
 *H01L 21/677* (2006.01)
 *H01L 21/673* (2006.01)
 *H01L 21/683* (2006.01)
 *H01L 21/687* (2006.01)

(52) U.S. Cl.
 CPC ...... *H01L 21/67742* (2013.01); *H01L 21/682* (2013.01); *H01L 21/6833* (2013.01); *H01L 21/68742* (2013.01)

(56) References Cited

U.S. PATENT DOCUMENTS

| | | | |
|---|---|---|---|
| 2018/0144969 A1 | 5/2018 | Thirunavukarasu et al. | |
| 2018/0151403 A1 | 5/2018 | Smith | |

FOREIGN PATENT DOCUMENTS

| | | |
|---|---|---|
| CN | 200944704 Y | 9/2007 |
| CN | 101604499 B | 4/2011 |
| CN | 102195588 A | 9/2011 |
| CN | 202189772 U | 4/2012 |
| CN | 102460129 A | 5/2012 |
| CN | 102482760 A | 5/2012 |
| CN | 102760679 A | 10/2012 |
| CN | 103572240 A | 2/2014 |
| CN | 103282540 B | 2/2015 |
| CN | 204490492 U | 7/2015 |
| CN | 104820306 A | 8/2015 |
| CN | 106148908 A | 11/2016 |
| CN | 108165927 A | 6/2018 |
| CN | 208142163 U | 11/2018 |
| CN | 109554662 A | 4/2019 |
| CN | 109561580 A | 4/2019 |
| DE | 29707686 U1 | 6/1997 |
| EP | 0470541 B1 | 10/1995 |
| EP | 2494646 B1 | 12/2017 |
| EP | 2852469 B1 | 4/2019 |
| JP | 3158181 B2 | 4/2001 |
| JP | 2009076227 A | 4/2009 |
| JP | 4809288 B2 | 11/2011 |
| JP | 2012104393 A | 5/2012 |
| JP | 2012216614 A | 11/2012 |
| JP | 2013209700 A | 10/2013 |
| JP | 2013209710 A | 10/2013 |
| JP | 2013211139 A | 10/2013 |
| JP | 2013245392 A | 12/2013 |
| JP | 5570939 B2 | 8/2014 |
| JP | 2017057485 A | 3/2017 |
| JP | 2018003142 A | 1/2018 |
| JP | 2018003151 A | 1/2018 |
| JP | 6393802 B1 | 9/2018 |
| JP | 6448067 B2 | 1/2019 |
| JP | 6461235 B2 | 1/2019 |
| JP | 6468540 B2 | 2/2019 |
| JP | 2019039072 A | 3/2019 |
| JP | 2019083311 A | 5/2019 |
| KR | 101322530 B1 | 10/2013 |
| KR | 20180059804 A | 6/2018 |
| KR | 101979149 B1 | 5/2019 |
| TW | 200730419 A | 8/2007 |
| WO | 1990004320 A2 | 4/1990 |
| WO | 2012053402 A1 | 4/2012 |
| WO | 2014112512 A1 | 7/2014 |
| WO | 2014114360 A1 | 7/2014 |
| WO | 2017222009 A1 | 12/2017 |
| WO | 2018153480 A1 | 8/2018 |
| WO | 2018153481 A1 | 8/2018 |
| WO | 2018166636 A1 | 9/2018 |
| WO | 2019020166 A1 | 1/2019 |
| WO | 2019091561 A1 | 5/2019 |
| WO | 2019101319 A1 | 5/2019 |
| WO | 2019114806 A1 | 6/2019 |

# METHOD OF PRE ALIGNING CARRIER, WAFER AND CARRIER-WAFER COMBINATION FOR THROUGHPUT EFFICIENCY

CROSS-REFERENCE TO RELATED APPLICATIONS

This application claims the benefit to U.S. Provisional Application No. 62/879,341, filed Jul. 26, 2019, which is incorporated by reference herein.

BACKGROUND

Field

Embodiments of the present disclosure generally relate to a method of pre-aligning a carrier and a substrate in a processing system.

Description of the Related Art

In semiconductor processing for applications such as depositions of layers of a photodiode, a wafer is loaded onto an oversized carrier and moved through a multi-chamber processing cluster tool. A wafer disposed on a carrier needs to be properly aligned, for example, for loading a mask on top of a wafer during deposition processing. This requires proper clocking of the carrier before the deposition processing. Therefore, there is a need for a method to provide proper a sequence of pre-alignment of a carrier, a substrate, and a combination of a carrier and a substrate disposed on the carrier.

SUMMARY

Embodiments of the present disclosure generally relate to a method that includes aligning and positioning a carrier in a predetermined orientation and location within a first front opening pod (FOUP) of a cluster tool, transferring the carrier to a charging station of the cluster tool, transferring a substrate from a second front opening pod (FOUP) of the cluster tool to the charging station and chucking the substrate onto the carrier, transferring the carrier having the substrate thereon from the charging station to a factory interface of the cluster tool, aligning the carrier having the substrate thereon in the factory interface of the cluster tool such that during substrate processing within a processing platform of the cluster tool the carrier is properly oriented and positioned relative to components of the processing platform, where the processing platform comprises one or more processing chambers, transferring the aligned carrier having the substrate thereon from the factory interface to the processing platform of the cluster tool for substrate processing, and transferring the aligned carrier having the processed substrate thereon from the processing platform to the factory interface.

In another embodiment, a carrier for holding a substrate thereon during substrate processing in a cluster tool includes a portable electrostatic chuck configured to hold a substrate on a surface of the portable electrostatic chuck using electro static forces, where the portable electrostatic chuck has one or more flat portions and a notch, the one or more flat portions being configured to be aligned against sidewalls of a shelf in a front opening pod (FOUP) of a cluster tool, the notch being configured to be aligned with a protrusion on the shelf.

In yet another embodiment, a cluster tool includes a first front opening pod (FOUP) configured to store one or more carriers in a predetermined orientation and location, a second front opening pod (FOUP) configured to store one or more substrates, a charging station configured to chuck a substrate onto a carrier and de-chuck a substrate from a carrier, a factory interface comprising a pre-aligner configured to align a carrier having a substrate chucked thereon, a processing platform comprising one or more processing chambers, a factory interface robot configured to transfer a carrier between the first FOUP and the charging station, a substrate between the second FOUP and the charging station, and a carrier having a substrate thereon between the charging station to the pre-aligner and between the pre-aligner and the processing platform, and a controller configured to control the factory interface robot to transfer a carrier from the first FOUP to the charging station in a predetermined orientation and position, and the pre-aligner to align a carrier having a substrate thereon such that during substrate processing within the processing platform of the cluster tool the carrier is properly oriented and positioned relative to components of the processing platform.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a pre-alignment system for a carrier and a substrate disposed on the carrier before substrate processing. The alignment system can allow substrate processing without alignment of the substrate during the substrate processing.

Figure 1:
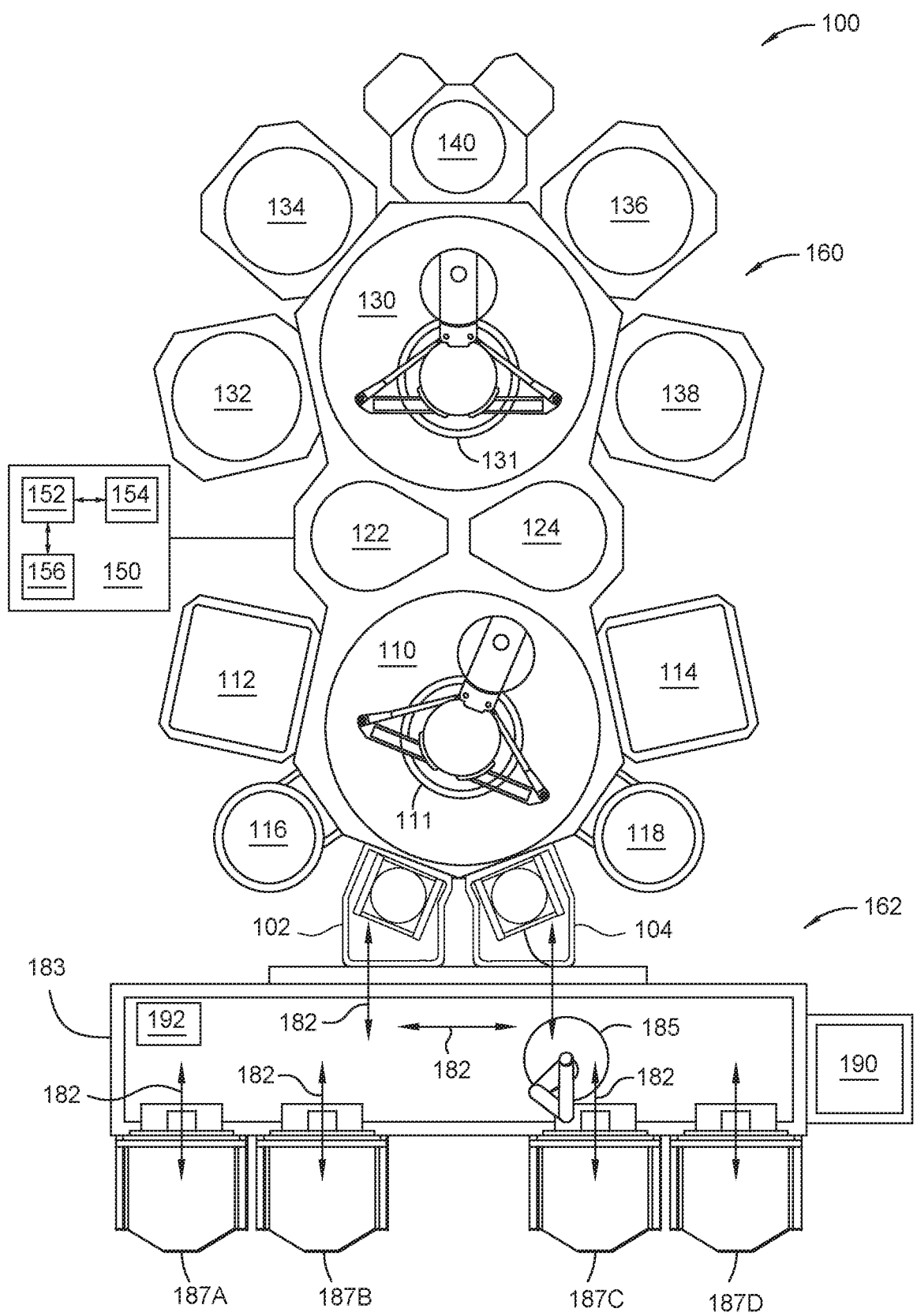
FIG. 1 is a schematic illustration of a processing system according to one embodiment.

FIG. 1 illustrates a processing system 100 for processing a substrate (e.g., a wafer) according to one or more embodiments. For example, the processing system 100 may deposit one or more metal oxide layers and/or organic materials on a substrate to fabricate a light sensing device. For example, the light sensing device may be an organic image sensing device. An example of a processing system includes the ENDURA® system, commercially available from Applied Materials, Inc. of Santa Clara, Calif. Alternatively, other substrate processing systems may be also be modified in accordance with the present disclosure.

The processing system 100 includes a vacuum-tight processing platform 160, a factory interface 162, and a controller 150. Further, the processing system 100 may also be referred to as a cluster tool or multi-chamber processing system.

The processing platform 160 includes one or more processing chambers. For example, the processing platform 160 may include processing chambers 112, 114, 116, 118, 132, 134, 136, 138, and 140. Further, the processing platform 160 includes one or more transfer chambers. For example, as is illustrated in FIG. 1, the processing platform 160 includes transfer chambers 110 and 130. The processing platform 160 may also include one or more pass-through chambers that allow a substrate to be transferred between transfer chambers. For example, the pass-through chambers 122, 124 may allow a substrate to be transferred between the transfer chambers 110 and 130.

The processing platform 160 may also include one or more load lock chambers. For example, as is illustrated in FIG. 1, the processing platform 160 includes load lock chambers 102, 104. The load lock chambers 102, 104 may be pumped down to be operated under a vacuum before transferring substrates from the factory interface 162 to the transfer chamber 110.

The factory interface 162 includes one or more docking stations 183, one or more factory interface robots 185, and a charging station 190. The docking stations 183 include one or more front opening unified pods (FOUPs) 187A, 187B, 187C, 187D. The factory interface robot 185 may be capable of linear and rotational movement illustrated by arrows 182. Further, the factory interface robot 185 may transfer substrates and carriers between the FOUPs 187A-D, the load lock chambers 102, 104, and the charging station 190. The charging station 190 may be configured to mount the substrate on a carrier or remove the substrate from the carrier. For example, a carrier may include one or more conductive elements (e.g., chucking electrodes) configured to electrostatically hold (i.e., "chuck") the substrate against the carrier. The carrier and "chucked" substrate may be transferred by the factory interface robot 185 from the charging station 190 to one or more of the load lock chambers 102, 104 for processing the substrate within the processing platform 160. Subsequently, the carrier and the processed substrate may be transferred from the load lock chambers 102, 104 to the charging station 190 such that the processed substrate may be removed from the carrier, and the processed substrate may be transferred from the charging station 190 to one of the FOUPs 187A-D by the factory interface robot 185. One or more pre-aligner 192 may be disposed in the factory interface 162 to align the substrate and the carrier by identifying the center of the carrier and a notch on the carrier so that the carrier can be properly oriented relative to and then desirably positioned on components within the processing platform 160.

The transfer chamber 110 includes a transfer robot 111. The transfer robot 111 transfers substrates to and from the load lock chambers 102, 104, to and from the processing chambers 112, 114, 116, and 118, and to and from pass-through chambers 122, 124. The pass-through chambers 122 and 124 may be utilized to maintain vacuum conditions while allowing substrates to be transferred within the processing platform 160 between the transfer chambers 110 and 130. The transfer chamber 130 includes a transfer robot 131. The transfer robot 131 transfers substrates between the pass-through chambers 122, 124 and the processing chambers 132, 134, 136, 138, and 140, and among the processing chambers 132, 134, 136, 138, and 140.

The processing chambers 112, 114, 116, 118, 132, 134, 136, 138, and 140 may be configured in any manner suitable to process a substrate. For example, the processing chambers 112, 114, 116, 118, 132, 134, 136, 138, and 140 may be configured to deposit one or more metal oxide layers, one or more organic films and apply one or more cleaning processes to a substrate to create a semiconductor device such as a photodiode, a light sensing device, or the like.

The processing chambers, e.g., the processing chambers 112, 114, 116, 118 may be configured to perform a pre-clean process to eliminate contaminants and/or degas volatile components from a substrate prior to transferring the substrate into another process chamber. The processing chamber 138 may be configured to deposit one or more layers on a substrate. The one or more layers may be fabricated from indium tin oxide (ITO), silicon oxide, silicon nitride, aluminum oxide, or any suitable material. The processing chambers 132, 134, 136 may be configured to deposit one or more organic films on a substrate. Further, the processing chamber 140 may be configured to position a mask (e.g., a shadow mask) on a substrate before the substrate is transferred to one or more of the processing chambers 132, 134, 136 and 138 and unload a mask from a substrate after processing within one or more of the processing chambers 132, 134, 136, and 138. The processing chambers 132, 134, 136, 138 may be configured to deposit materials (e.g., metal oxide layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others.

The controller 150 is configured to control the components of the processing system 100. The controller 150 may be any suitable controller for controlling the operation of one or more of the processing chambers 112, 114, 116, 118, 132, 134, 136, 138, and 140, the transfer chambers 110 and 130, pass-through chambers 122, 124, and the factory interface 162. For example, the controller 150 may be configured to control the operation of the transfer robot 111, the transfer robot 131, and the factory interface robot 185. The controller 150 includes a central processing unit (CPU) 152, a memory 154, and support circuits 156. The CPU 152 may be any general purpose computer processor that may be utilized in an industrial environment. The support circuits 156 are coupled to the CPU 152 and may include cache, clock circuits, input/output subsystems, power supplies and the like. Software routines may be stored within the memory 154. The software routines may be executed by the CPU 152 and thus be adapted to cause various components within the processing system 100 to perform one or more of the methods described herein. Alternatively, or additionally, one or more of the software routines may be executed by a second CPU (not illustrated). The second CPU may be part of the controller 150 or remote from the controller 150.

One or more processing chambers 112, 114, 116, 118, 132, 134, 136, 138, and 140, one or more transfer chambers 110 and 130, one or more pass-through chambers 122, 124, and/or the factory interface 162 may have a dedicated controller or controllers (not shown) configured to control at least a portion of the methods disclosed herein. The dedicated controllers may be configured similar to the controller 150 and may be coupled with the controller 150 to synchronize processing of a substrate within the processing system 100.

Figure 2:
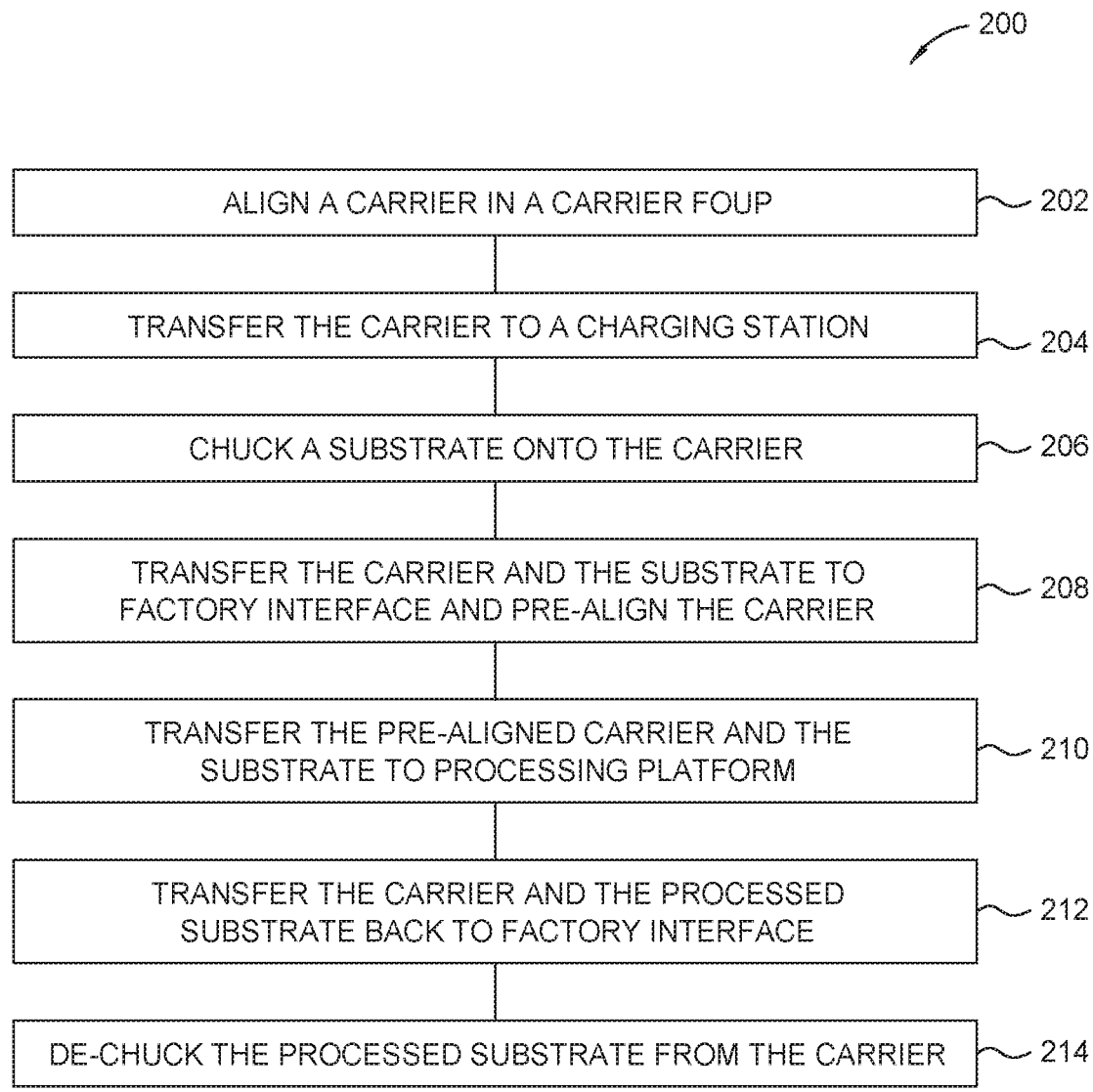
FIG. 2 illustrates a flow chart of a method for processing a substrate according to one embodiment.

FIG. 2 illustrates a flow chart of a method 200 for processing a substrate, according to one or more embodiments. At operation 202, a carrier is aligned and positioned in predetermined orientation and location within one of the FOUPs 187A-D, for example, in the FOUP (referred to as a "carrier FOUP") 187D. A carrier and the carrier FOUP 187D may have any suitable structural features that are used to align and position the carrier within the carrier FOUP 187D. An example of a carrier and the carrier FOUP 187D is described below in relation to FIGS. 3, 4A, and 4B.

At operation 204, the aligned carrier is transferred to the charging station 190 by the factory interface robot 185. An orientation and a position at which the factory interface robot 185 transfers the carrier to the charging station 190 are controlled by the controller 150 based on the predetermined orientation and location of the carrier within the carrier FOUP 187D.

At operation 206, a substrate (e.g., a 300 mm wafer) is transferred from one of the FOUPs 187A-C to the charging station 190 by the factory interface robot 185. The substrate is then aligned with carrier and chucked onto a front surface of the carrier. A carrier and a substrate may each have one or more features, such as a notch, that are used to align and position the substrate in a predetermined orientation and location onto the carrier.

In some embodiments, the carrier is a portable electrostatic chuck (ESC) configured to hold the substrate using electrostatic forces. The portable ESC includes one or more electrodes embedded therein. After power is applied to the one or more electrodes to chuck the substrate to the front surface of the carrier, the electrostatic forces remain with the carrier and the substrate even after power is no longer supplied to the one or more electrodes (i.e., during the transfer of the substrate and carrier within a processing system, such as the processing system 100). As such, the substrate is advantageously prevented from moving during the transfer of the carrier. An example of the charging station 190 is described below in relation to FIGS. 5A, 5B, and 6.

At operation 208, the carrier having the substrate chucked on the front surface of the carrier is transferred from the charging station 190 to the pre-aligner 192 in the factory interface 162. The pre-aligner 192 orients and positions of the carrier, by identifying structural features of the carrier, so that the carrier can be properly oriented and positioned relative to components within the processing platform 160 during proceeding substrate processing. Thus, there is no need to re-align the carrier and the substrate during the substrate processing. An orientation and a position at which the carrier is aligned in the pre-aligner 192 are controlled by the controller 150 based on the predetermined orientation and location of the carrier within the charging station 109.

An example of proper orientation and positioning of a carrier is relative to lift pins of substrate supports within one or more chambers 102, 104, 112, 114, 116, 118, 122, 124, 132, 134, 136, 138, and 140. The carrier having a substrate on the front surface of the carrier is aligned such that during proceeding substrate processing the lift pins are in contact with a back surface of the carrier to lift the carrier without contacting the substrate through one or more of the cutout regions. An example of lift pins is described below in relation to FIG. 7.

Another example of proper orientation and positioning of a carrier is relative to a mask to be deposited on or over a surface of a substrate that is chucked onto the carrier. A mask may be aligned and placed on or over a substrate in a mask alignment chamber, such as a processing chamber 140. A mask includes a predetermined pattern of openings to allow material to be deposited on a surface of the substrate at positions corresponding to the openings.

At operation 210, the pre-aligned carrier having the substrate thereon is transferred to the processing platform 160 by the factory interface robot 185 for substrate processing. In some embodiments, the carrier having the substrate thereon is transferred from the factory interface 162 to one of the processing chambers 112, 114, 116, and 118 though one of the load lock chamber 102, 104 for substrate processing. The substrate is further transferred to one or more of the processing chambers 132, 134, 136, 138 for additional substrate processing and transferred back to the factory interface 162 through one of the pass-through chambers 122 and 124. Substrate processing may include deposition of one or more layers on the substrate through a mask. The one or more layers may be one or more organic films, such as OPFs. In some embodiments, the one or more layers include a bilayer bulk heterojunction. In some embodiments, the bilayer bulk heterojunction includes tris (8-hydoxyquinolinato) aluminum (Alq3) or buckminsterfullerene ($C_{60}$). The one or more layers have a pattern corresponding to the first predetermined pattern of openings of the first mask. The one or more layers may be deposited by any suitable method, such as CVD, PECVD, MOCVD, ALD, or PVD. The layer may be deposited in a processing chamber, such as the processing chamber 138 (shown in FIG. 1). In some embodiments, the layer is deposited by a PVD process. The processing chamber for depositing the layer is part of a processing system, such as the processing system 100. The carrier and the substrate on the carrier are pre-aligned at operation 208 such that the carrier and the substrate do not need to be re-aligned during the entire substrate process at operation 210.

At operation 212, the carrier having the processed substrate thereon is transferred from the processing platform 160 to the pre-aligner 192 in the factory interface 162 and aligned such that the processed substrate and the carrier can be properly oriented and placed in the charging station 190. An orientation and a position at which the carrier is aligned in the pre-aligner 192 are controlled by the controller 150 based on the orientation and the position of the carrier in the pre-aligner 192 prior to the substrate processing process in operation 208.

At operation 214, the processed substrate is removed ("de-chucked") from the carrier. Operations 202-214 may be repeated to process another substrate.

Figure 3:
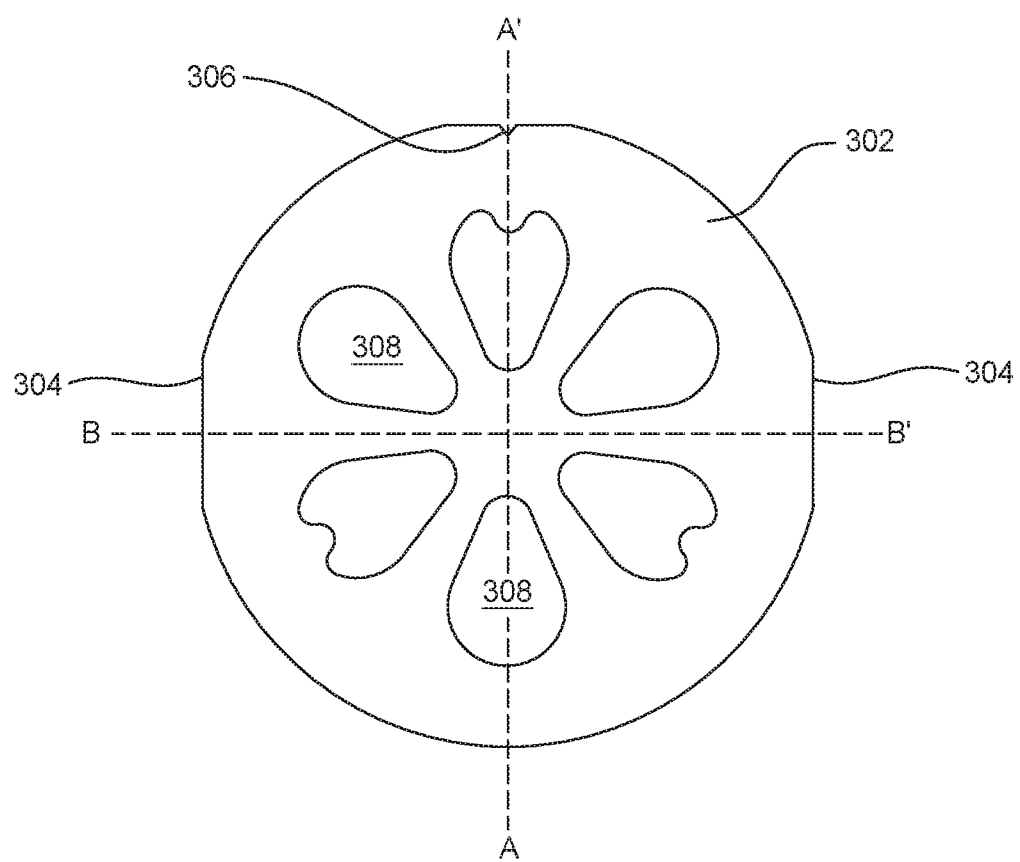
FIG. 3 is a schematic illustration of a carrier according to one embodiment.
Figure 4A:
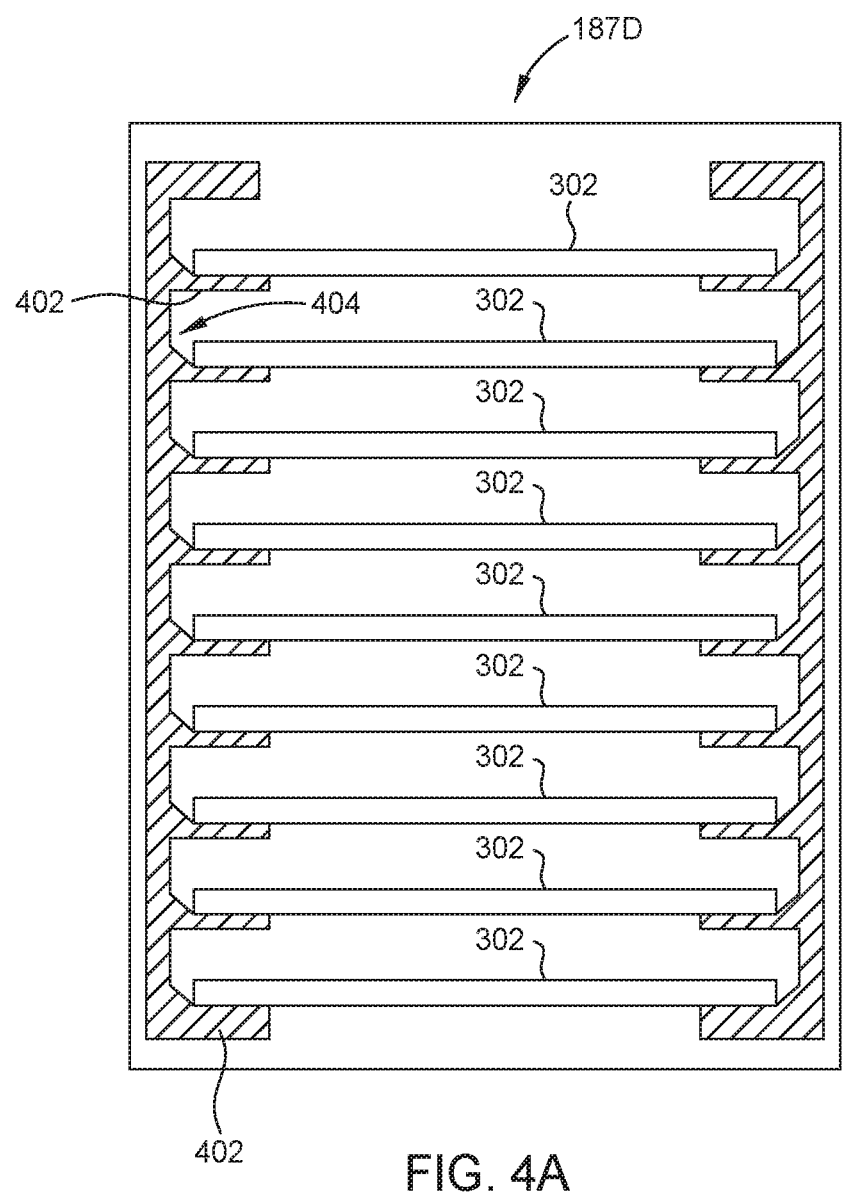
FIGS. 4A and 4B are an internal side view and an internal top view of a carrier FOUP according to one embodiment.
Figure 4B:
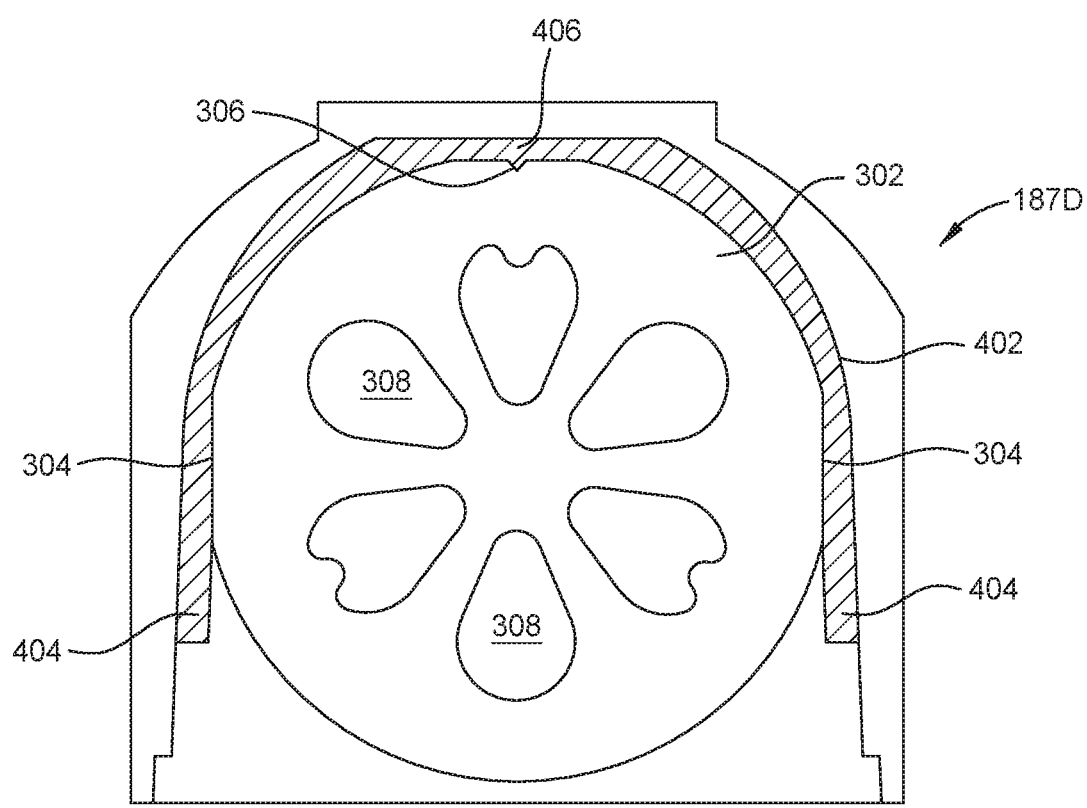

FIG. 3 is a schematic illustration of a carrier 302 according to one embodiment. FIGS. 4A and 4B are an internal side view and an internal top view of the carrier FOUP 187D according to one embodiment. A carrier 302 is aligned and positioned in a predetermined orientation and a position in the carrier FOUP 187D by a hardware design. That is, the carrier 302 has flat portions 304 and a notch 306. The carrier FOUP 187D has shelves 402, each of which has straight sidewalls 404 and a protrusion 406. The carrier 302 is placed on a shelf 402 and oriented such that the flat portions 304 are aligned against the sidewalls 404 and the notch 306 is aligned with the protrusion 406 on the shelf 402. The factory interface robot 185 moves a pre-aligned carrier 302 with orientation, determined by the design of the sidewalls 404 and the protrusion 406, from the carrier FOUP 187D to the charging station 190.

A diameter of the carrier 302 is between about 300 mm and about 330 mm, for example, about 318 mm. Length of the flat portions 304 is between about 50 mm and about 100 mm, for example, about 70 mm. Depth of the notch 306 from the outer perimeter of the carrier 302 is between about 2 mm and about 4 mm, for example, about 3.1 mm.

A thickness of the carrier 302 is between about 2 mm and about 5 mm, for example, about 4 mm. The carrier 302 may include one or more cutout regions 308 where material of the carrier 302 has been removed to reduce the weight of the carrier 302. Further, the cutout regions 308 may be the same size or one or more of the cutout regions 308 may be larger than another one of the cutout regions 308. Additionally, or alternatively, the cutout regions 308 may be arranged such that the cutout regions 308 are symmetric about a centerline of the carrier 302. Further, the cutout regions 308 may be arranged such that the cutout regions 308 are not symmetric about a centerline of the carrier 302.

An example of the carrier FOUP 187D having nine shelves 402 is shown in FIG. 4A, but the carrier FOUP 187D may have more or less than nine shelves 402. A thickness of each shelf 402 may be between 2 mm and about 4 mm, for example, about 3 mm and the shelves 402 are aligned vertically with a pitch between 18 mm and about 22 mm, for example, about 20 mm.

Figure 5A:
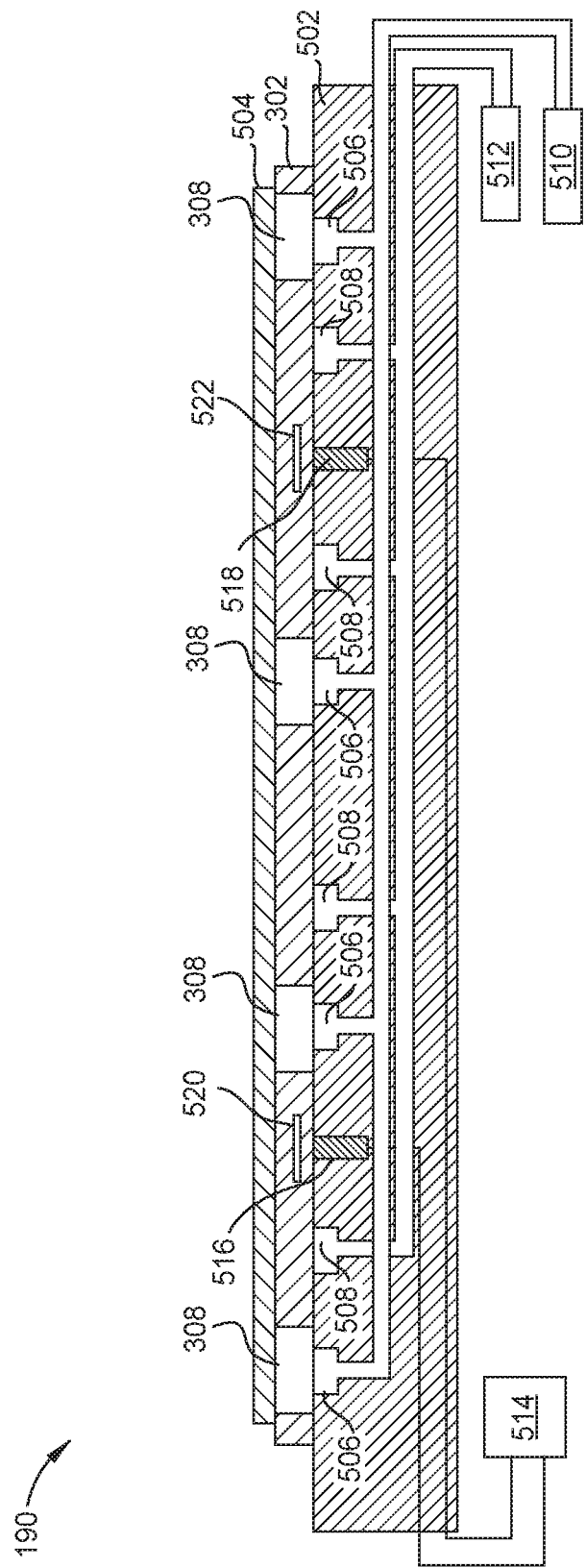
FIG. 5A is a schematic view of a charging station according to one embodiment.
Figure 5B:
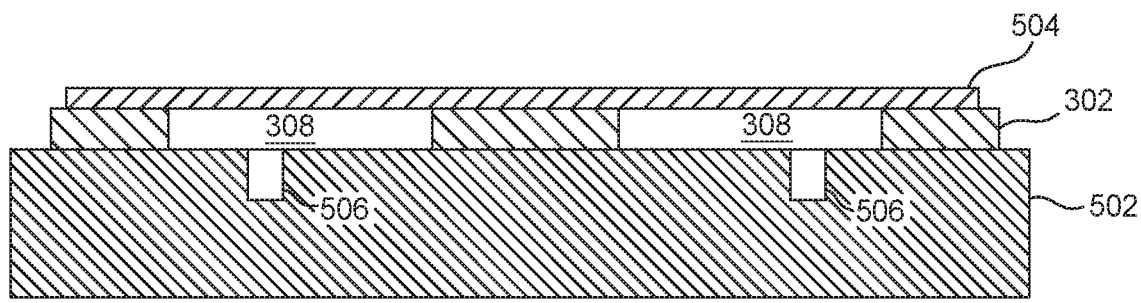
FIG. 5B is a schematic view of a charging station along A-A' of FIG. 3.
Figure 5C:
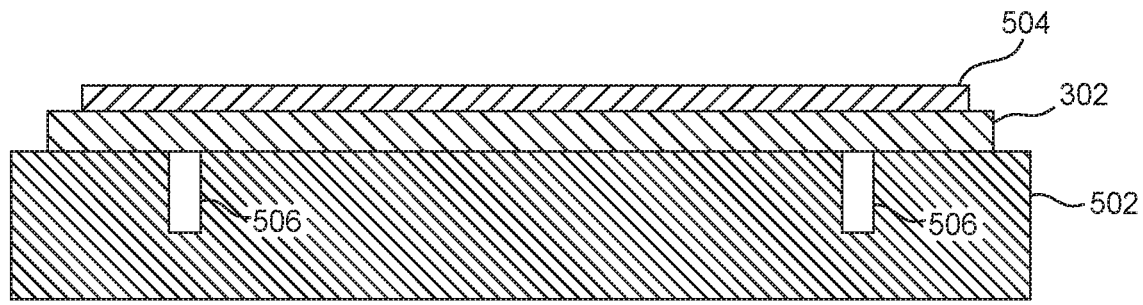
FIG. 5C is an illustration of schematic view of a charging station along B-B' of FIG. 3.

FIG. 5A is a schematic view of the charging station 190 in which a carrier 302 is disposed over a chuck 502 of the charging station 190 according to one embodiment. FIG. 5B is a schematic view of the charging station 190 along A-A' of FIG. 3. FIG. 5C is an illustration of schematic view of the charging station along B-B' of FIG. 3. A wafer 504 is disposed over and aligned with the carrier 302. The chuck 502, which is positioned below the carrier 302 and the wafer 504, includes vacuum ports 506 and vacuum ports 508. The vacuum ports 506 and vacuum ports 508 are separately connected to a vacuum source (not shown) and a control valve (not shown) so that a vacuum pressure can be selectively applied to the vacuum ports 506 or the vacuum ports 508 by use of commands from the controller 150. As illustrated, the vacuum ports 506 are positioned such that the vacuum ports 506 are aligned with the cutout regions 308 and the vacuum ports 506 are able to interact with the wafer 504. Alternatively, the vacuum ports 506 may be positioned in different locations such that vacuum ports 506 are able to interact with the wafer 504. For example, the carrier 302 may include dedicated ports that couple to the vacuum ports 506 and allow the vacuum ports 506 to interact with the wafer 504. The vacuum ports 508 interact with the carrier 302.

The charging station 190 further includes pumping devices 510, 512, and power supply 514. The pumping devices 510 and 512 are coupled to vacuum ports 506 and 508, respectively, through isolation valves (not shown). The pumping device 510 generates a vacuum between the wafer 504 and the chuck 502 via the vacuum ports 506. The pumping device 512 generates a vacuum between the carrier 302 and the chuck 502 via the vacuum ports 508. Generating the vacuum between the carrier 302 and the chuck 502, and between the carrier 302 and the wafer 504, holds the carrier 302 and the wafer 504 in substantially constant position relative to each other while the wafer 504 is electrostatically chucked to the carrier 302. Additionally, the pumping device 510 may pump a gas into the space between the chuck 502 and the wafer 504 via the vacuum ports 506. Further, the pumping device 510 may include a sensor (not shown) that is configured to monitor the pressure of the gas between the chuck 502 and the wafer 504 to determine whether or not the wafer 504 is chucked to the carrier 302 during an electrostatic chucking process or during an electrostatic de-chucking process.

The chuck 502 includes electrical pins 516 and 518. The electrical pins 516 and 518 are coupled to power supply 514. The carrier 302 includes the electrodes 520 and 522. The power supply 514 may drive the electrical pins 516 and 518 such that the electrical pins 516 and 518 are electrically biased with regard to each other. For example, the electrical pin 516 may be driven with a positive voltage (e.g., at least about 1 KV) and the electrical pin 518 may be driven a corresponding negative voltage (e.g., at least about −1 KV). Driving the electrical pins 516 and 518 alters the charge on the electrodes 520 and 522 of the carrier 302, generating an electrical chucking force between the wafer 504 and the carrier 302. Further, the power supply 514 may drive the electrical pins 516 and 518 with other voltages to de-chuck, or decouple, the wafer 504 from the carrier 302. For example, the power supply 514 may drive the electrical pins 516 and 518 with voltages of the opposite polarity as described above to de-chuck the wafer 504 from the carrier 302.

Figure 6:
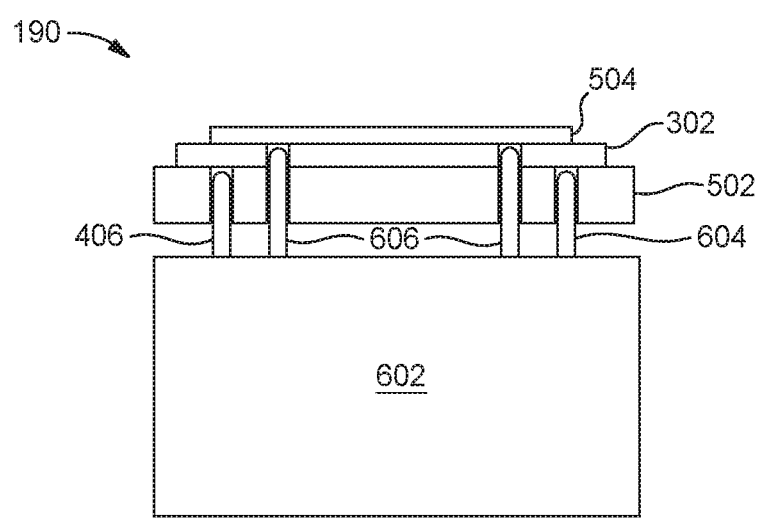
FIG. 6 illustrates a portion of a charging station including an actuator according to one embodiment.

FIG. 6 illustrates a portion of the charging station 190 including an actuator 602. The actuator 602 includes pins 604 and pins 606. The actuator 602 may move the pins 604 and 606 toward and away from and the chuck 502. For example, the pins 604 may move toward the actuator 602 to lower the carrier 302 onto the chuck 502 when the carrier 302 is placed into the charging station 190 by the factory interface robot 185. The pins 604 may be in an extended position to receive the carrier 302 when the carrier 302 is loaded. Further, the pins 604 may be moved away from the actuator 602 to lift the carrier 302 off of the chuck 502 to remove the carrier 302 from the charging station 190. Further, the pins 606 may be moved toward from the actuator 602 to lower the wafer 504 onto the carrier 302 when the wafer 504 is placed into the charging station 190. The pins 606 may be in an extended position to receive the wafer 504 when the wafer 504 is loaded. Further, the pins 606 may be utilized to lift the wafer 504 off of the carrier 302 such that the wafer 504 may be removed from the charging station 190.

Figure 7:
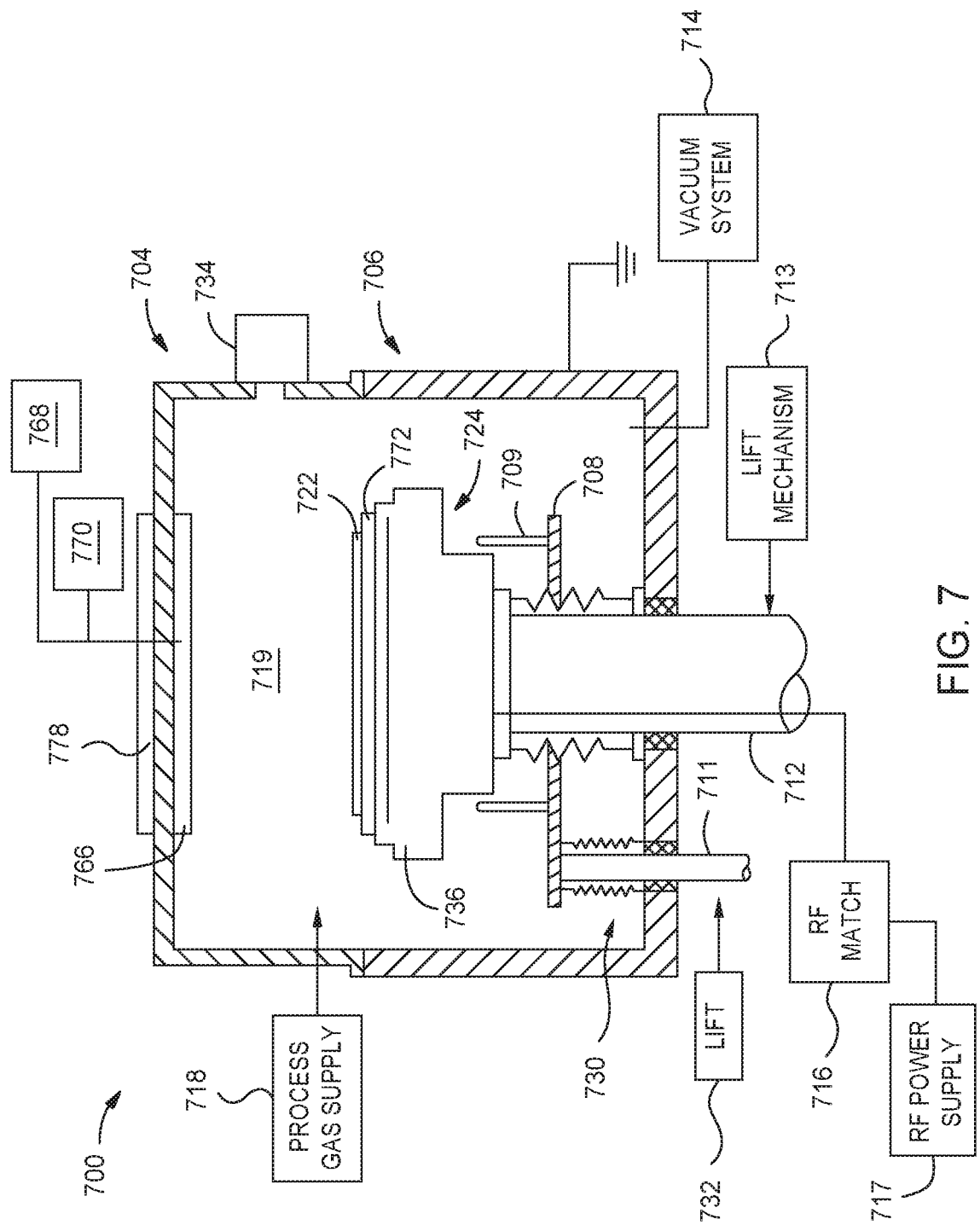
FIG. 7 is a schematic illustration of a processing chamber for depositing a layer according to one or more embodiments.

FIG. 7 is a schematic illustration of a processing chamber 700 for depositing a layer, according to one or more embodiments. The processing chamber 700 may be the processing chamber 138 shown in FIG. 1. The processing chamber 700 may be a PVD chamber for depositing a metal oxide layer. The processing chamber 700 includes a chamber body 706 covered by a lid 704 which encloses a processing region 719. A slit valve 734 is coupled to the chamber body 706 and configured to facilitate the transfer of a substrate 722 disposed on a front surface of a carrier 742 into and out of the processing chamber 700. The chamber body 706 may be grounded to enable plasma to be formed therein.

A substrate support 724 is disposed within the processing region 719 for supporting the carrier 742 carrying the substrate 722. The substrate support 724 includes a pedestal 736 and a shaft 712 coupled to the pedestal 736. The shaft 712 may be coupled to a lift mechanism 713 that provides vertical movement of the substrate support 724. An RF power supply 717 and a RF match 716 are coupled to the pedestal 736 for providing a bias power to the substrate 722 and the carrier 742.

The processing chamber 700 further includes a substrate lift system 730. The substrate lift system 730 includes a platform 708 coupled to a shaft 711, which can be lifted by a lift 732. Lift pins 709 are mounted on the platform 708, and the lift pins 709 are configured to go through through-holes (not shown) formed in the pedestal 736 and in contact with a back surface of the carrier 742 to lift the carrier 742 carrying the substrate 722 on the front surface of the carrier 742 without contacting the substrate 722. The processing chamber 700 further includes a vacuum system 714 to control the pressure within the processing chamber 700.

The processing chamber 700 further includes a target 766 disposed within the processing region 719. A power source 768 is coupled to the target 766 to apply a voltage to the target 766. In some embodiments, an RF power supply 770 may be coupled to the target 766 to apply RF power to the target 766 to facilitate control of the radial distribution of a deposition rate on the substrate 722. A magnetron assembly 778 may be disposed over the target 766 to assist in plasma processing within the processing chamber 700. A process gas supply 718 is coupled to the processing chamber 700 for providing one or more process gases to the processing region 719.

The method for pre-alignment of a carrier and a substrate disposed on the carrier is presented. A carrier and a substrate disposed thereon are aligned only before and after substrate processing such that the alignment of the carrier and the substrate is not required during the substrate processing.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    aligning and positioning a carrier in a predetermined orientation and location within a first front opening pod (FOUP) of a cluster tool;
    transferring the carrier to a charging station of the cluster tool using a factory interface robot;
    transferring a substrate from a second front opening pod (FOUP) of the cluster tool to the charging station using the factory interface robot and chucking the substrate onto the carrier;
    transferring the carrier having the substrate thereon from the charging station to a factory interface of the cluster tool using the factory interface robot;
    aligning the carrier having the substrate thereon in a pre-aligner of the factory interface of the cluster tool such that during substrate processing within a processing platform of the cluster tool the carrier is properly oriented and positioned relative to components of the processing platform, wherein the processing platform comprises one or more processing chambers;
    transferring the aligned carrier having the substrate thereon from the factory interface to the processing platform of the cluster tool for substrate processing using the factory interface robot; and
    transferring the aligned carrier having the processed substrate thereon from the processing platform to the factory interface using the factory interface robot.

2. The method according to claim 1, wherein the carrier having the substrate thereon is not re-aligned during substrate processing within the processing platform of the cluster tool.

3. The method according to claim 1, wherein the carrier having the substrate thereon is aligned in the factory interface of the cluster tool such that lift pins in the one or more processing chambers within the processing platform of the cluster tool do not touch the substrate through cutouts of the carrier.

4. The method according to claim 1, wherein the carrier having the substrate thereon is aligned in the factory interface of the cluster tool such that a mask is properly aligned and positioned on the substrate in one of the processing chambers within the processing platform of the cluster tool.

5. The method according to claim 1, wherein aligning and positioning a carrier within the first FOUP of the cluster tool comprises aligning structural features of the carrier relative to structural features of the first FOUP of the cluster tool.

6. The method according to claim 1, further comprising chucking the substrate onto the carrier aligning features of the substrate relative to features of the carrier.

7. The method according to claim 1, further comprising:
    aligning the carrier having the processed substrate thereon in the factory interface;
    transferring the aligned carrier having the processed substrate thereon from the factory interface to the charging station; and
    de-chucking the processed substrate from the carrier.

8. A cluster tool, comprising:
    a first front opening pod (FOUP) configured to store one or more carriers in a predetermined orientation and location;
    a second front opening pod (FOUP) configured to store one or more substrates;
    a charging station configured to chuck a substrate onto a carrier and de-chuck a substrate from a carrier;
    a factory interface comprising a pre-aligner configured to align a carrier having a substrate chucked thereon;
    a processing platform comprising one or more processing chambers;
    a factory interface robot configured to transfer a carrier between the first FOUP and the charging station, a substrate between the second FOUP and the charging station, and a carrier having a substrate thereon between the charging station to the pre-aligner and between the pre-aligner and the processing platform; and
    a controller configured to control:
        the factory interface robot to transfer a carrier from the first FOUP to the charging station in a predetermined orientation and position; and
        the pre-aligner to align a carrier having a substrate thereon such that during substrate processing within the processing platform of the cluster tool the carrier is properly oriented and positioned relative to components of the processing platform.

9. The cluster tool according to claim 8, wherein a carrier having a substrate thereon is not re-aligned during substrate processing within the processing platform of the cluster tool.

10. The cluster tool according to claim 8, wherein the carrier having the substrate thereon is aligned by the pre-aligner such that lift pins in the one or more processing chambers within the processing platform of the cluster tool do not touch the substrate through cutouts of the carrier.

11. The cluster tool according to claim 8, wherein the carrier having the substrate thereon is aligned by the pre-aligner such that a mask is properly aligned and positioned on the substrate in one of the processing chambers within the processing platform of the cluster tool.

12. The cluster tool according to claim 8, wherein a carrier is aligned and positioned within the first FOUP by use of structural features of the carrier relative to structural features the first FOUP of the cluster tool.

13. The cluster tool according to claim 8, wherein a substrate is aligned onto a carrier by use of features of the substrate and features of the carrier.

* * * * *